United States Patent [19]
Eckerle

[11] 4,042,890
[45] Aug. 16, 1977

[54] HIGH EFFICIENCY ELECTRICAL POWER CONDITIONER

[76] Inventor: Joseph S. Eckerle, Star Route 2, La Honda, Calif. 94020

[21] Appl. No.: 686,332

[22] Filed: May 14, 1976

[51] Int. Cl.$^2$ ............................................. H03F 21/00
[52] U.S. Cl. .................................. 330/207 A; 330/10; 330/51
[58] Field of Search ........................ 330/10, 51, 207 A

[56] References Cited
U.S. PATENT DOCUMENTS 3,585,517   6/1971   Herbert .................................. 330/10

Primary Examiner—Rudolph V. Rolinec
Assistant Examiner—Lawrence J. Dahl
Attorney, Agent, or Firm—Townsend and Townsend

[57] ABSTRACT

An A.C. powered amplifier for converting low power information input signals to corresponding signals of a substantially increased power level without requiring a power transformer. A signal processor having a low power information signal input and a feedback signal input controls the state of a controllable switch. The switch power input is coupled to a source of relatively high A.C. voltage via a rectifier circuit and a first low pass filter circuit, and the switch output is coupled to the amplifier output terminal via a second low pass filter circuit. A feedback path is provided from either the switch output or the amplifier output terminal to the feedback signal input of the signal processor. The signal processor may comprise a pulse width, or pulse frequency modulation circuit.

The amplifier provides high efficiency, low power loss, and has a band width limited only by the maximum switching frequency of the controllable switch.

16 Claims, 12 Drawing Figures

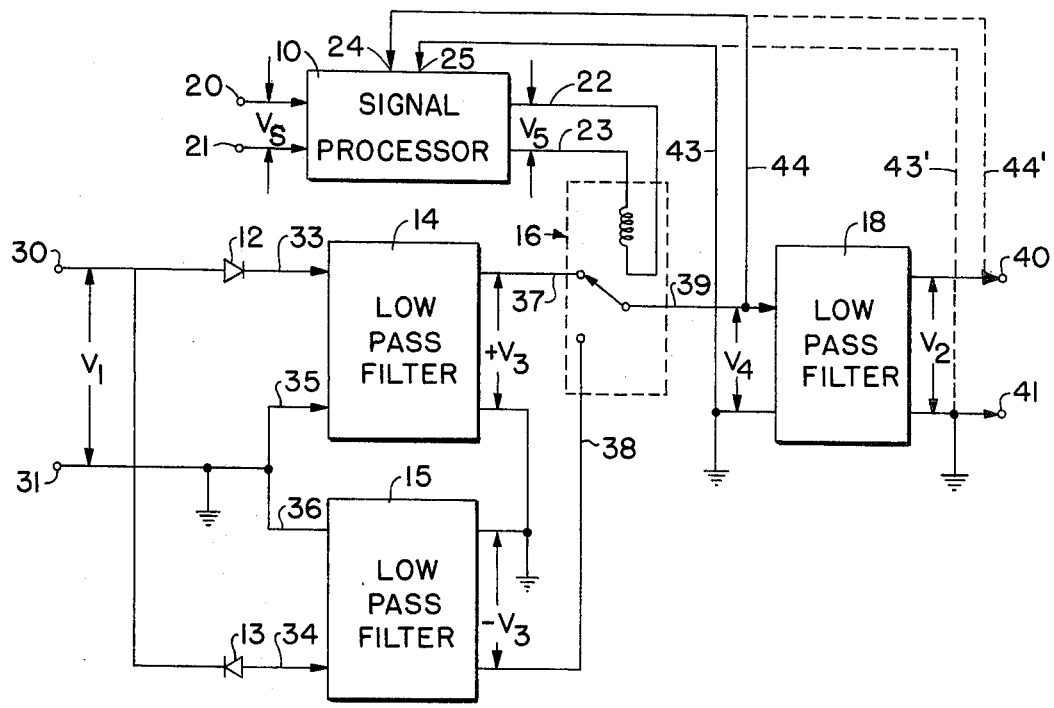
FIG._1.
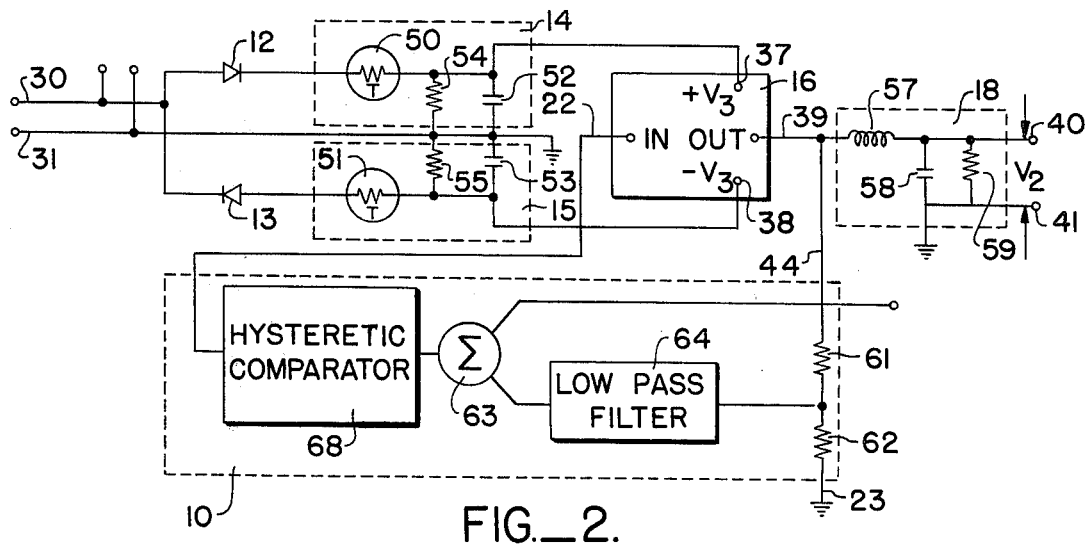
FIG._2.
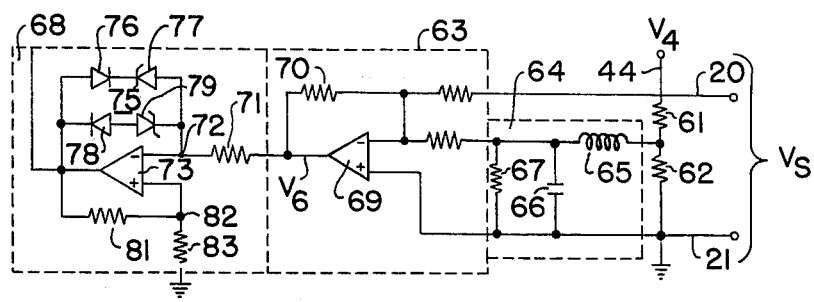
FIG._3.

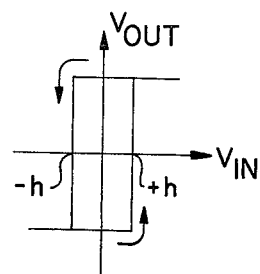
FIG._4.
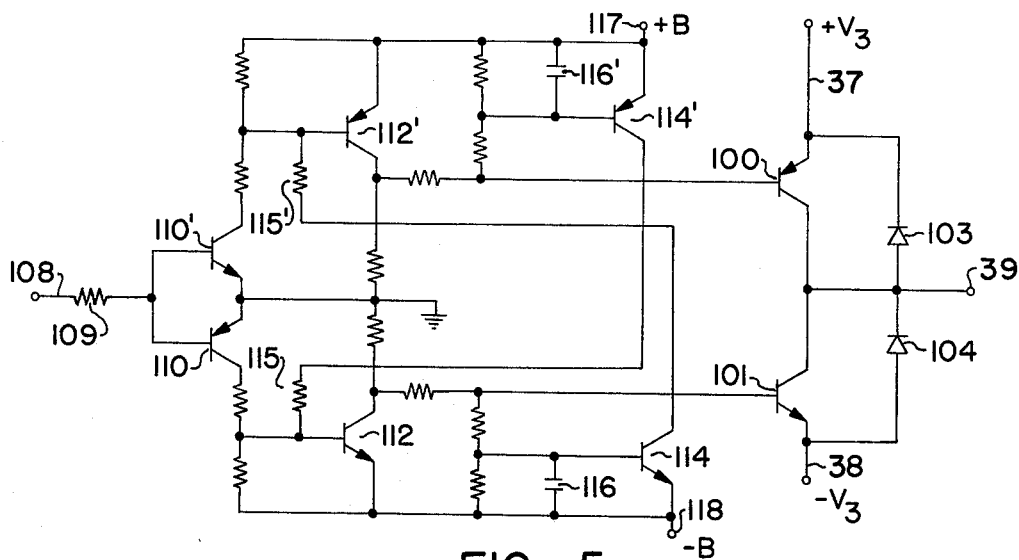
FIG._5.
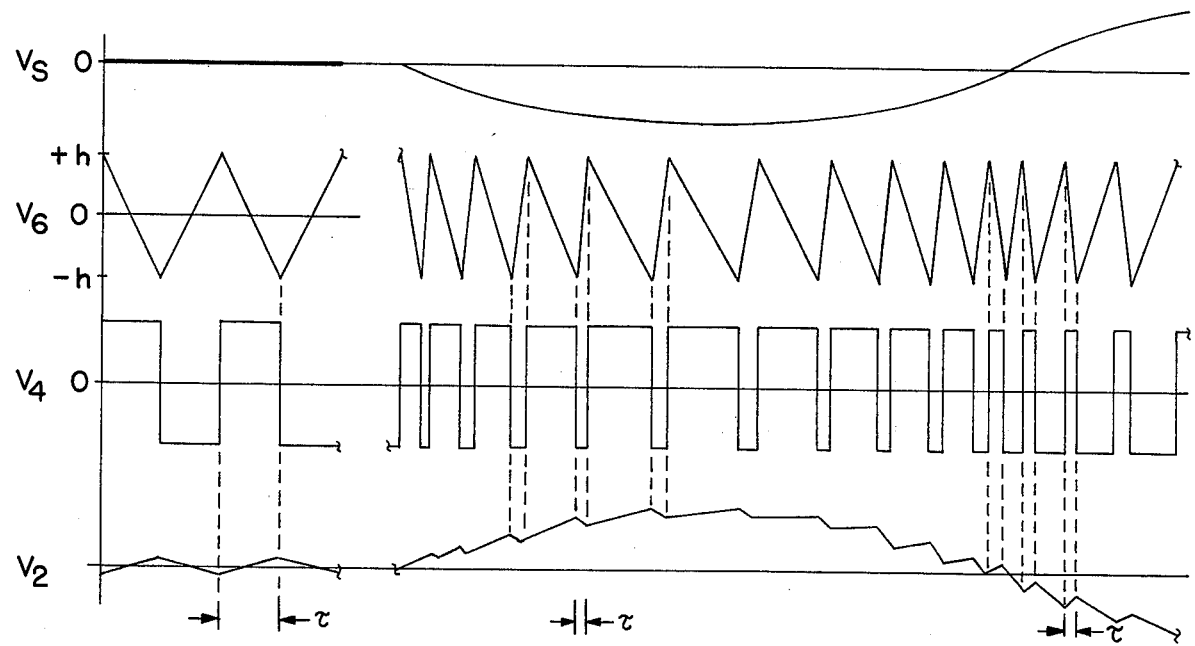
FIG._6.

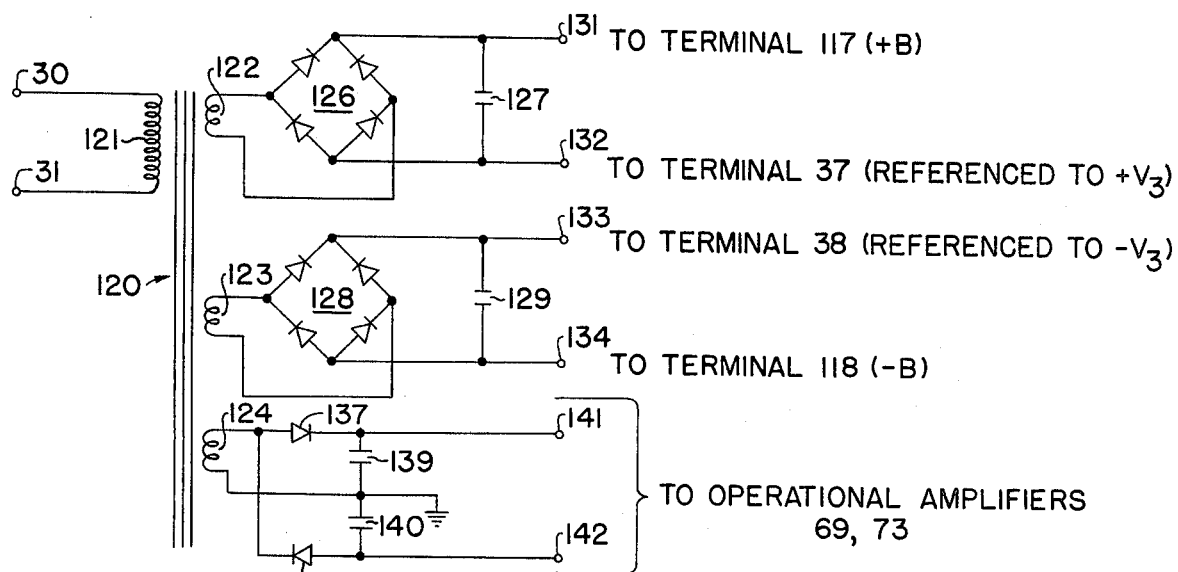
FIG._7.
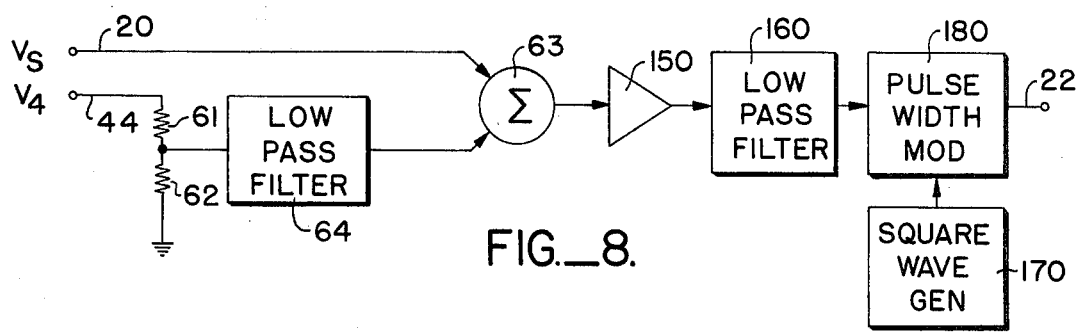
FIG._8.
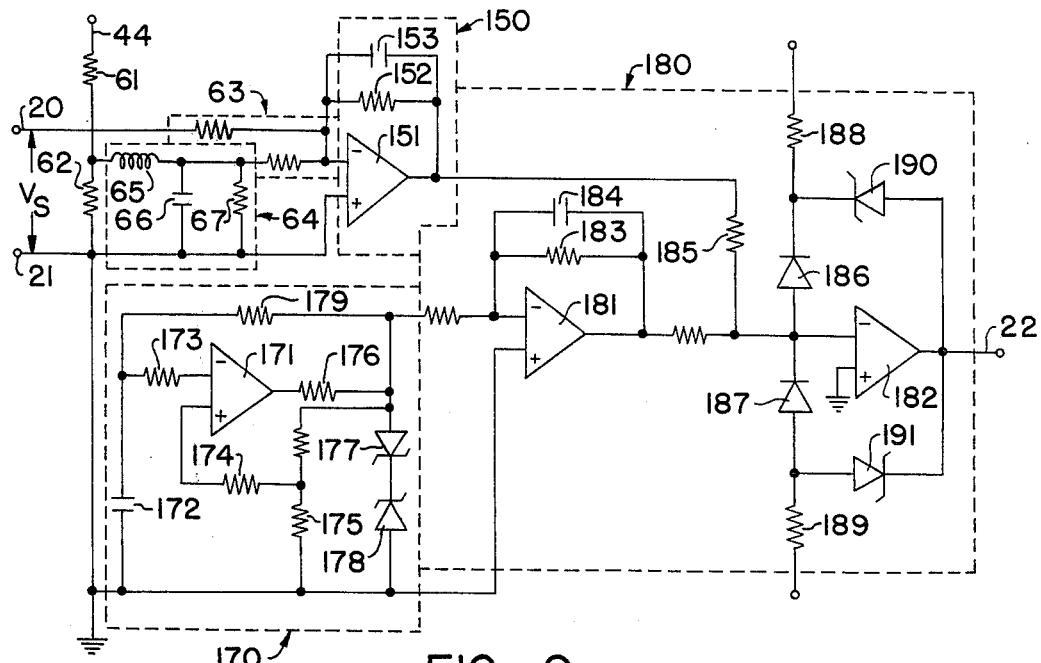
FIG._9.

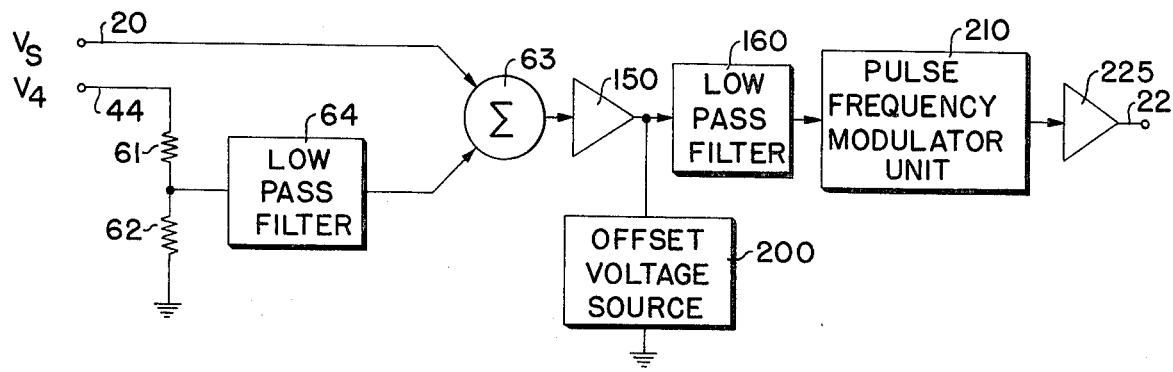
FIG._10.
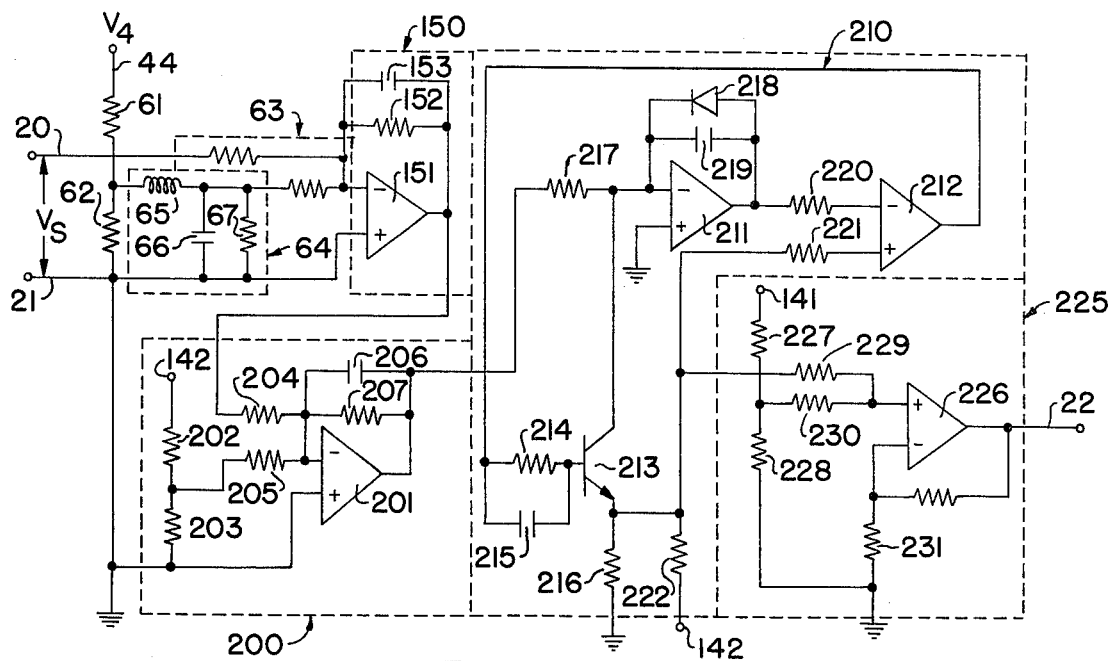
FIG._11.
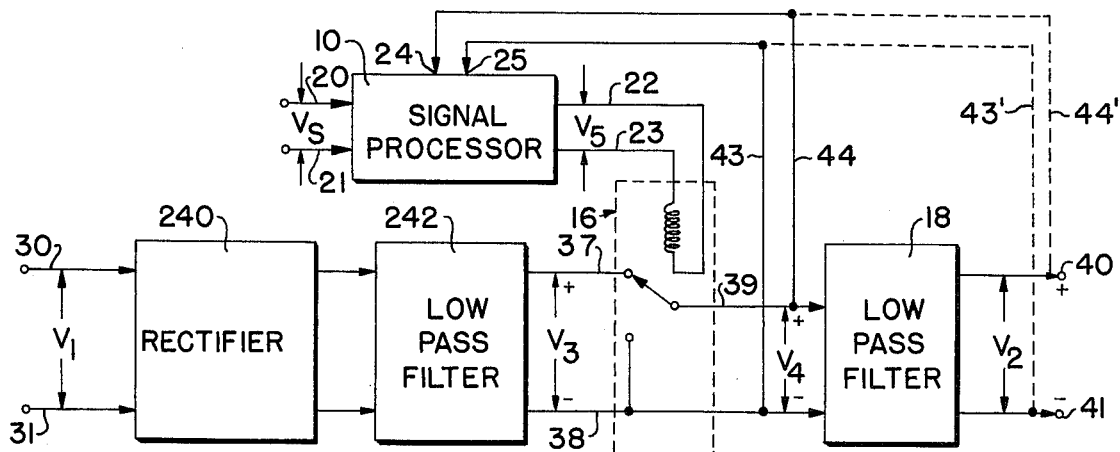
FIG._12.

HIGH EFFICIENCY ELECTRICAL POWER CONDITIONER

BACKGROUND OF THE INVENTION

This invention relates to power amplifier circuits. More particularly, this invention relates to circuitry of the above type used to increase the power level of an information signal by drawing power from an A.C. supply.

Power amplification circuits are known which function to increase the power level of an information signal to a level required to operate associated utilization devices by drawing power from the A.C. mains. Such circuits have a wide variety of uses, and special circuits have been developed for many particular applications, including servo control, cathode ray tube deflection, audio signal amplification, electric motor drive and other comparable uses. Known power amplifiers typically require a large power transformer in order to convert the A.C. voltage supplied by the mains to a suitable D.C. voltage. Such transformers are expensive to manufacture, are relatively large in size and weight, and generate significant amounts of useless heat which, unless dissipated, adversely affect the performance of other active and passive electrical circuit elements used in amplifier circuits. Power amplifier circuits employing a large power transformer suffer accordingly from the disadvantages inherrent in the use of such a large transformer.

Ideally, any power amplifier circuit should be relatively insensitive to component parametric changes in order to provide stable operation of the circuit. Further, a power amplifier circuit should ideally convert the electrical A.C. power to D.C. power with a minimum of heat generation to avoid parametric changes in the remaining circuit components. In addition, a power amplifier circuit should be compatible with a wide variety of loads, such as complex reactance loads, loads with characteristics which change with frequency, and regenerative loads (those which briefly supply power to the amplifier circuit), so that the performance of the amplifier circuit is not affected by the nature of the load. Moreover, the operating band width of a power amplifier circuit should be compatible with the anticipated range of frequencies to be amplified and, ideally, to be suitable for a wide variety of uses the band width should extend from about 0 HZ to several thousand KHZ. Efforts to design a power amplifier circuit approaching these characteristics have not been successful to date.

SUMMARY OF THE INVENTION

The invention comprises a power amplifier circuit which requires no power transformer operating at the A.C. mains frequency and no output transformer, which operates in a switching mode to provide high efficiency and inherent stability, which is compatible with a wide variety of loads, and which possesses an extremely wide band width limited at the upper end only by the maximum possible switching frequency of one of the sub-units of the invention.

In its most general form, the invention comprises means for converting an A.C. power signal to a D.C. power signal; first means for filtering the D.C. power signal to substantially reduce high frequency fluctuations therefrom; a signal processor having first input terminal means adapted to be coupled to a source of relatively low power signals to be amplified, a feedback input terminal means, and an output terminal means; a controllable switch having a power input terminal means coupled to the output of the first filtering means, a control input terminal coupled to the signal processor output terminal means and an output terminal coupled to the feedback input terminal means of the signal processor; and second means coupled to the output terminal of the controllable switch means for filtering the power amplified signals from the switch means and having output terminal means adapted to be coupled to a utilization device. Alternatively, the feedback input terminal means of the signal processor is coupled to the output terminal means of the second filtering means.

The converting means preferably includes means for providing D.C. power signals of substantially equal magnitude and opposite polarity.

The controllable switch means preferably comprises an electronic switching circuit having a pair of opposite conductivity type power switching transistors coupled in series between the opposite polarity D.C. power signals, and control circuit means for operating the power transistors in a mutually exclusive switching mode in response to control signals input thereto from the signal processor.

The signal processor may comprise a pulse width modulation circuit, a pulse frequency modulation circuit or a combination thereof.

The power amplifier circuit of the invention is relatively inexpensive to fabricate; is small, lightweight and highly efficient; is substantially independent of the nature of the load and the source of the signals to be amplified; and is useful in a wide variety of applications.

For a fuller understanding of the nature and advantages of the invention, reference should be had to the ensuing detailed description taken in conjunction with the accompanying drawings.

BRIEF DESCRIPTION OF THE DRAWINGS

FIG. 1 is a block diagram of a first embodiment of the invention;

FIG. 2 is a partially schematic diagram of the embodiment of FIG. 1 showing a first signal processor;

FIG. 3 is a schematic diagram of the first signal processor of FIG. 2;

FIG. 4 is a diagram illustrating the signal transfer characteristic of the hysteretic comparator of FIGS. 2 and 3;

FIG. 5 is a schematic diagram of the controllable switch of FIG. 2;

FIG. 6 is a waveform diagram illustrating the operation of the first embodiment;

FIG. 7 is a schematic diagram of a suitable source of operating voltages for portions of the circuit of FIG. 2;

FIG. 8 is a block diagram of an alternate signal processor providing pulse-width modulation;

FIG. 9 is a schematic diagram of the signal processor of FIG. 8;

FIG. 10 is a block diagram of an alternate signal processor providing pulse-frequency modulation;

FIG. 11 is a schematic diagram of the signal processor of FIG. 10; and

FIG. 12 is a block diagram of an alternate embodiment of the invention.

DESCRIPTION OF THE PREFERRED EMBODIMENTS

Turning now to the drawings, FIG. 1 shows a block diagram of a first embodiment of the invention. As seen in this FIG., the invention comprises the following basic elements: a signal processor 10, a pair of rectifiers 12, 13 first and second low pass filters 14, 15, a controllable switch 16 and a third low pass filter 18.

Signal processor 10 has a pair of input terminals 20, 21 for receiving low power electrical signals $V_s$ to be amplified which are supplied from a suitable source, such as a phonograph pickup, a musical instrument pickup, a servo system error signal generator, and the like. Signal processor 10 further includes a pair of output terminals 22, 23 coupled to a control input of switch 16 for operating this latter element, and a pair of feedback input terminals 24, 25.

Rectifiers 12 and 13 are coupled to a first input terminal 30 of a pair of terminals 30, 31 adapted to be coupled to an electrical power source, such as the A.C. mains, which supply alternating current voltage $V_1$ to the unit, rectifiers 12, 13 being coupled in opposite polarity. Rectifier 12 converts the A.C. input voltage $V_1$ to a half-wave rectified D.C. voltage of a first polarity which is coupled to a first input terminal 33 of low pass filter 14. Rectifier 13 converts the A.C. input voltage $V_1$ to a half-wave rectified D.C. voltage of opposite polarity, which is coupled to a first input terminal 34 of low pass filter 15. Remaining input terminals 35, 36 of filters 14, 15 are coupled to A.C. input terminal 31 for voltage referencing. Low pass filters 14, 15 function to smooth out high frequency variations in the input voltages supplied thereto. The output voltages supplied by filters 14, 15 are coupled to first and second power input terminals 37, 38 of controllable switch 16.

The output 39 of controllable switch 16 is coupled to a third low pass filter 18, which also filters out high frequency variations in the amplified signal, which is then coupled to output terminals 40, 41. Output terminals 40, 41 are coupled to any suitable load, such as a loudspeaker, a servo motor, the deflection coils of a cathode ray circuit, and the like. The signals output from controllable switch 16 are also fed back via conductors 43, 44 to feedback input terminals 24, 25 of signal processor 10. Alternatively, as suggested by broken lines 43', 44', the feedback signal to signal processor 10 may be obtained from the output of filter 18.

The FIG. 1 unit operates in the following manner. Low power information signals $V_s$ coupled to signal processor 10 control the state of switch 16 in such a manner that the voltage $V_4$ developed at the input to low pass filter 18 is a modulated signal containing the original information content of information signals $V_s$ at a substantially higher power level. The modulation mode may comprise any one of several possible modes, for example pulse width modulation, pulse frequency modulation or a combination of both. Signal processor 10 supplies only negligible power to the circuit, and substantially all of the power is supplied from the A.C. source $V_1$. Demodulation of the signal $V_4$ is performed by filter 18. The demodulated signal $V_2$ drives the load device. It is important to note that the elements 12–15 and 18 are completely passive devices, and that the only active elements in the unit are signal processor 10 and controllable switch 16.

Switch 16 is represented in FIG. 1 by the symbol for a conventional relay in order to indicate that this element may comprise any active device or combination of active and passive devices which realize the transfer function of a relay, viz. switching with negligible power dissipation.

The theoretical constraints on the circuit of FIG. 1 may be generally described as follows. The function of the FIG. 1 power conditioner is to ensure that $$V_2(t) = 0 \; KV_s(t) + E(t) \tag{1}$$

where $V_s$ and $V_2$ are as defined above, $K$ is a constant and $E(t)$ is an error signal. The signal processor 10 has a binary output which can be represented by the two states 1 and 0. Signal processor 10 must be designed such that the signal output therefrom satisfies the following condition $$KV_s(t) = F^{-1}[T(j\omega)] \; F \; [V_4(t)] + E(t). \tag{2}$$

where $T(j\omega)$ is the transfer function of a low pass filter with a corner frequency $\omega_c \simeq 5\omega_o$ where $\omega_o$ is the maximum frequency present in the input signal $V_s$; F $(V_4(t))$ is the Fourier transform of $V_4(t)$ and $F^{-1}$ of the bracketed expression denotes the inverse Fourier transform of that expression.

Passive low pass filter 18 must be designed to satisfy the condition $\omega_1 \simeq \omega_o$, where $\omega_1$ is the corner frequency of filter 18, with the power load connected to terminals 40, 41. The characteristics of the load thus must be taken into consideration in the design of the low pass filter 18. In many applications, the load can be modeled as a frequency dependent complex reactance $X(j\omega)$.

If $$|X(j\omega)| > R_{min} \text{ for } \omega < \omega_o \tag{3}$$

where $R_{min}$ is a minimum value of the load reactance, then a suitable low pass filter can always be designed by one skilled in the art.

Perhaps the most significant difference between an ideal controllable switch and a practical realization thereof is the existence of a delay between the switching command, i.e. the output of signal processor 10, and the instant of switching of element 16. In many cases, it is possible to satisfy equation (2) when $V_3$ is not well regulated and controllable switch 16 contains such a delay. Reference may be had to the discussion contained in the technical publication entitled "Two-State Modulation System" by A.G. Bose, WESCON Technical Papers, Volume 7, part 6, number 7.1 (1963) for a theoretical analysis of the problem. In such cases, the output of the FIG. 1 power conditioner can be represented most accurately by the following expression $$V_2(t) = KV_s(t - t_d) + E(t) \tag{4}$$

where $t_d$ is the delay in the controllable switch 16.

For proper operation, the following conditions must be met. The power input voltage $V_1$ must satisfy the condition $$\int Q \, dt > 0 \tag{5}$$

where $Q = V_1$ if $V_1 > V_O$ $Q = 0$ if $V_1 \leq V_O$ for most cases of interest, $V_O$ satisfies the condition:

$$0 < KV_s(t) < V_O, \; V_O \text{ a constant.} \tag{6}$$

If rectifier 12 comprises a full wavebridge rectifier, $V_s$ need only satisfy the following lesser constraint:

$$0 < KV_s(t) < \text{Max} \ |V_1(t)|. \tag{7}$$

FIG. 2 shows a block diagram of signal processor 10 and the detailed circuit elements comprising subunits 14, 15 and 18 of the system of FIG. 1. Low pass filters 14, 15 include a pair of thermistors 50, 51 which function to limit in-rush currents in order to protect diodes 12, 13 when power is first applied to the circuit, a pair of capacitors 52, 53 and a pair of resistors 54, 55 interconnected as shown. The outputs of low pass filters 14, 15 comprise a relatively stable pair of high D.C. voltages of opposite polarity, designated $+V_3$ and $-V_3$, which are coupled respectively to terminals 37, 38 of controllable switch 16, described below. Low pass filter 18 comprises an inductor 57, a capacitor 58, and a resistor 59 having parameters chosen in accordance with the conditions noted above.

With reference to FIGS. 2 and 3, signal processor 10 includes a voltage divider network comprising a pair of fixed resistors 61, 62 for coupling a portion of the feedback signal from switch 16 or filter 18 to a summing circuit 63 via a low pass filter 64 comprising an inductor 65, a capacitor 66, and a resistor 67 having the frequency response $T(j\omega)$ noted supra. The remaining input to summing circuit 63 is the low voltage information input signal $V_s$. The summed signals are supplied from summing circuit 63 to a comparator 68 having the signal transfer characteristic shown in FIG. 4. Summing circuit 63 includes an operational amplifier 69 having a first input terminal coupled to a summing junction and a second terminal coupled to ground. Amplifier 69 is provided with a feedback resistance 70 which functions to limit the gain of amplifier 69. The output voltage signal $V_6$ of summing circuit 63 is substantially proportional to the error signal $$E(t) = V_2(t) - KV_s(t)$$

noted supra.

The output of operational amplifier 69 is coupled via a resistance 71 to a first input terminal 72 of a second operational amplifier 73 having a diode network comprising a first pair of cathode connected diodes 76, 77 and a second pair of anode connected diodes 78, 79. A resistor 81 is coupled between the output of amplifier 73 and a second input terminal 82 which is referenced above ground by means of resistance 83. Amplifier 73 and the associated circuit elements comprise a comparator with hysteresis which generates a signal of a first level whenever the summed differential signal input on terminal 72 exceeds the level of the reference signal on terminal 82, and a signal of a second level otherwise. The signal transfer characteristic of a comparator with hysteresis is shown in FIG. 4. The output of amplifier 73 is coupled to the control input terminal of switch 16.

The signal processor 10 operates in the following manner. The output of signal processor 10 will switch to the opposite state whenever the error signal, $E(t)$ exceeds the hysteresis, $h$, of the comparator 68. By this action, the error, which is a measure of the distortion in the amplification process, is made smaller than the hysteresis, $h$. For this reason, it is desirable that the hysteresis be as small as possible.

FIG. 6 illustrates the response of the system of FIGS. 1-3 to both a steady state input signal and a variable amplitude information input signal. For convenience and clarity, the steady state response is shown with an expanded time scale at the left side of the diagram. As seen in this portion of the FIG., a steady state D.C. input signal $V_s$ causes the voltage $V_6$ present at the output of amplifier 69 to fluctuate in a manner resembling a saw-tooth or a triangular waveform with maximum amplitude equal to the magnitude of the switching voltage of the hysteresis curve of FIG. 4. The time $\tau$ between successive peaks of opposite polarity is the response time for the amplifier 68 and represents the pulse width for an input signal $V_s$ of zero frequency. Typically, $\tau \approx (1/_c)$. The output signal $V_4$ from switch 16 is a succession of relatively high level rectangular pulses each having a width substantially equal to $\tau$. The output signal $V_4$ is integrated by low pass filter 18 to produce the steady state output signal $V_2$. It should be noted that the amplitude variations of signal $V_2$ are greatly exaggerated in FIG. 6 and that the actual signal produced exhibits only negligible amplitude variations in response to the steady state D.C. input signal $V_s$. The operation of the system in response to a steady state D.C. input signal $V_s$ of other than zero amplitude may be inferred from the zero steady state response and will be apparent to those skilled in the art.

The dynamic response of the system is shown in the right-hand portion of FIG. 6. For convenience and clarity the time scale is compressed and only a portion of a sine wave information input signal $V_s$ of a given frequency is shown. As seen in this portion of the FIG. as the amplitude of signal $V_s$ increases negatively, the time required for the error signal $V_6$ to transit from $+h$ to $-h$ increases, and the width of the positive amplitude pulse portion of signal $V_4$ correspondingly increases. The period between successive positive pulse portions of signal $V_4$ is constant and and approximately equals $1./\omega)_c$. As the amplitude of signal $V_s$ decreases negatively, the transit time from $+h$ to $-h$ decreases and the width of the successive corresponding positive pulse portions of signal $V_4$ decreases accordingly. When the amplitude of signal $V_s$ crosses the zero axis in the positive direction, the polarities of signals $V_6$ and $V_4$ likewise reverse and signal $V_4$ changes to a pulse train in which the width of the negative amplitude pulse portion varies in accordance with the magnitude of $V_s$. As noted above, signal $V_4$ is integrated by filter 18 which produces output signal $V_2$ comprising the inversion of signal $V_s$ at a substantially higher power level. Further, the magnitude of the high-frequency components are greatly exaggerated for purposes of illustration and the actual resulting output signal $V_2$ is a substantially continuous analog signal.

FIG. 5 shows the preferred embodiment of controllable switch 16. As shown in this FIG., controllable switch 16 includes a pair of power transistors 100, 101 of opposite conductivity type intercoupled in a common collector configuration. The emitter of transistor 100 is coupled to high positive reference D.C. voltage $-V_3$, while the emitter of transistor 101 is coupled to high negative reference D.C. voltage $-V_3$. The output signal is taken from the junction of the collectors of transistors 100, 101. Diodes 103, 104 limit the voltage on output terminal 39 to $-V_3$ or $-V_3$ and are deemed necessary due to the inductance 57 present in low pass filter 18 to which terminal 39 is coupled.

The remaining circuit elements control the switching of transistors 100, 101 so that $-V_3$ is coupled to terminal 39 when transistor 100 is conducting and transistor 101 is switched off, and so that $-V_3$ is coupled to terminal 39 when transistor 101 is switched on and transistor 100 is switched off.

The control portion of the circuitry of FIG. 5 is essentially symmetric with each half of the circuit having transistors of opposite conductivity type from the other half of the circuit. For this reason, the upper elements are labeled with primed reference numerals corresponding to the unprimed reference numerals of the lower half of the circuit.

Reference bias voltages +B and −B are supplied from the circuits shown in FIG. 7 to the emitter of transistor 114′,114 and are reference voltages required for the proper operation of the circuit. The magnitude of voltage +B is greater than the magnitude of voltage $V_3$.

The circuit operates in the following manner. The input signal to the circuit on terminal 108 supplied from signal processor 10 is a low power signal in the range from about +10 to about −10 volts and having a voltage level which is either high or low. If the level of the input signal is high, transistor 110′ will be switched on while transistor 110 will be switched off. With transistor 110 switched off, the voltage at the base of transistor 112 will be equal to −B and transistor 112 will be turned off. With transistor 112 switched off, the voltage at the base of power transistor 101 will be nearly equal to the ground reference potential and transistor 101 will be turned on. With transistor 101 turned on, the voltage $-V_3$ is applied to output terminal 39.

When the value of the input signal on terminal 108 drops to the low level, transistor 110 will be switched on, thereby causing current to flow in the path from the collector to −B The voltage on the base of transistor 112 will rise and transistor 112 will switch on. With transistor 112 switched on, the voltage at the base of transistor 101 will drop to a value closed to −B and transistor 101 will switch off.

As noted above, the upper half of the circuit of FIG. 3 operates in a complementary fashion.

In order to prevent simultaneous turn-on of both transistors 100 and 101, the collector of transistor 114 is coupled to the base of transistor 112′, while the collector of transistor 114′ is coupled to the base of transistor 112. Assuming transistor 100 is conducting, the voltage at the base of transistor 114′ will be close to the value of $-V_3$ and transistor 114′ will conduct. With transistor 114′ conducting, the value of the voltage at the collector thereof will be nearly equal to +B and this voltage is applied via biasing resistor 115 to the base of transistor 112 which will turn transistor 112 on heavily and override the effect produced if transistor 110 is suddenly switched off. After transistor 100 is turned off by a change in the level of the input voltage on terminal 108, the voltage at the base of transistor 114′ will rise to a value close to +B, thereby turning off transistor 114′ and removing the overriding control signal from the base of transistor 112. Capacitor 116′ is coupled between +B and the base of transistor 114′ to delay turn-off of this transducer in order to provide an added time delay to insure that transistor 100 is completely turned off before removing the overriding signal from the base of transistor 112. Transistor 112′ is controlled in a similar but complementary fashion by transistor 114 and capacitor 116.

FIG. 7 illustrates a suitable power supply for providing operating voltages for operational amplifiers 69, 73; and for generating referencing voltages +B and −B. As shown in this FIG., a transformer 120 has a primary winding coupled to A.C. input terminals 30, 31 and three secondary windings 122-124. Secondary winding 122 is coupled to the input of a full wave bridge rectifier circuit 126 having a smoothing capacitor 127 coupled across the output terminals thereof. Similarly, secondary winding 123 is coupled to the input of a full wave bridge rectifier 128 and has a smoothing capacitor 129 coupled across the output thereof. Terminals 131 and 134 are coupled to terminals 117 and 118 of the FIG. 5 circuit and provide reference voltages +B and −B, respectively. Terminals 132 and 133 are coupled to terminals 37 and 38 of the FIG. 5 circuit in order to reference the D.C. voltage from full wave bridge rectifiers 126 and 128 to $+V_3$ and $-V_3$, respectively.

Secondary winding 124 is coupled to a pair of half wave rectifiers comprising diodes 137, 138 and filter capacitors 139 and 140 having a common plate tied to ground reference and the remaining plate coupled to positive and negative reference voltage terminals 141, 142. Terminals 141 and 142 are coupled to the reference voltage inputs of operational amplifiers 69, 73 in a conventional manner.

While the circuit of FIG. 7 includes a transformer 120, it should be noted that only a small fraction of the output energy delivered to the load passes through this transformer. Thus, one advantage of the invention — viz the elimination of a power transformer of the type required by known amplifier circuits — is achieved in the preferred embodiments.

FIGS. 8 and 9 illustrate an alternate embodiment of signal processor 10 which generates a pulse width modulated signal for controlling the state of controllable switch 16. This embodiment shares in common with the embodiment of FIGS. 2 and 3 a voltage divider network comprising resistance 61, 62, summing circuit 63 and low pass filter 64. The signal output from summing circuit 63 is coupled by an amplifier unit 150 to a low pass filter 160, the output of which is coupled to the input of a pulse width modulator unit 180. The output of pulse width modulator unit 180 is coupled via lead 22 to the input of controllable switch 16.

As shown in FIG. 9, amplifier unit 150 includes an operational amplifier 151 and an RC feedback network comprising a resistance 152 and a capacitance 153. This network makes the amplifier 150 also perform the function of low pass filter 160. The corner frequency of the RC network is preferably $\omega_o$. Elements 151 and 152 comprising amplifier unit 150 function in a similar manner to elements 69 and 70 of the FIG. 3 embodiment.

Square wave generator unit 170 includes an operational amplifier 171 and associated circuit elements 172-179 which function as a square wave generator in a conventional manner (see "Operational Amplifiers: Design and Applications", Tobey, Graeme, and Huelsman, eds., McGraw-Hill, San Francisco, 1971, pp. 371-373).

Pulse width modulator unit 180 includes a pair of operational amplifiers 181, 182 and associated circuit elements 183-191 and functions in a conventional manner to provide a pulse train output having individual pulses whose width is a function of the magnitude of the difference between information input signal $V_s$ and the feedback signal $V_4$ or $V_2$. For further details see pages 411-413 of the above referenced text.

FIGS. 10 and 11 illustrate an alternate embodiment of signal processor 10 which provides pulse frequency modulation and which shares in common with the embodiment of FIGS. 8 and 9 elements 61-64, 150 and 160, the embodiment of FIGS. 10 and 11 includes an offset voltage source 200 comprising operational amplifier 201 and associated circuit elements 202-207. The positive offset voltage provided by source 200 is required to provide proper driving voltage to a pulse frequency modulation unit 210. Source 200 also provides additional gain to the signal from amplifier unit 150. It is noted that the corner frequency of both the R-C network comprising resistor 152 and capacitor 153, and the R-C network comprising resistor 207 and capacitor 206, is preferably $\omega_o$.

Pulse frequency modulation unit 210 includes a pair of operational amplifiers 211, 212, a transistor 213 and associated circuit elements 214-222 and functions in a conventional manner to generate a pulse train at the output thereof whose frequency is a function of the information input signal $V_s$. For a further description of the operation of unit 210 reference may be had to the above cited text on operational amplifiers, pages 405-409.

The output of pulse frequency modulator unit 210 is coupled to the input of amplifier unit 225 which comprises an operational amplifier 226 and associated circuit elements 227-231 and which amplify the signal input thereto and additionally provide a positive offset to the signal as required to provide a proper drive signal for controllable switch 16.

In all embodiments of the invention, a feedback signal is provided to signal processor 10, the feedback signal comprising either voltage $V_4$ from the output of controllable switch 16 or $V_2$ from the output low pass filter 18. This feedback signal path is an important requirement of the invention and considered indispensable to proper operation of the invention in order to render the system insensitive to variations in the magnitude of voltage $V_3$ supplied to the input terminals 37, 38 of controllable switch 16. Voltage $V_3$ fluctuates due to slow variations in line voltage and frequency due to changing loads on the external electrical power grid, variations in the magnitude of the input signal $V_s$ which cause the system to draw varying amounts of power from low pass filters 14, 15 and any high frequency variations present at the input to low pass filters 14, 15 which pass through these circuits and appear at the respective outputs thereto. It should be noted that, without this feedback signal, the above fluctuations in $V_3$ appear at output terminals 40, 41 and introduce intolerable distortion to the output signal.

FIG. 12 shows an alternate embodiment of the invention which employs a single full wave bridge rectifier 240 and a single low pass filter 242 in place of half wave rectifiers 12, 13 and low pass filters 14, 15, respectively. The remaining elements of the embodiment of FIG. 12 are substantially identical to those described above. Unlike the FIG. 1 embodiment, in which the output signal on terminals 40, 41 is referenced to the same ground potential as the AC input voltage, in the embodiment of FIG. 12 the output signals present on terminals 40, 41 are not so referenced. The operation of the FIG. 12 embodiment is substantially identical of that described above.

In all embodiments of the invention, the requirement found in known prior art power amplification devices of a heavy, costly power transformer is completely eliminated with the attendant advantage of lower manufacturing cost, more efficient utilization of the power provided by the A.C. line, negligible heat generation and savings in size and weight of the complete device. While the actual efficiency of the invention is dependent on the particular circuit design, operating voltages and component parameters employed, the theoretical efficiency of the invention is 100%, and efficiencies in the range of 90% can be expected. This figure is to be compared with the 40% attainable in typical commercially available high fidelity amplifiers. Negligible heat generation is due to the operation of the power active device, i.e. controllable switch 16, in the switching mode. Operation in the switching mode offers the further advantage that circuits designed for operation in this manner are relatively insensitive to changes in the parametric values of the various components comprising the circuit, which simplifies circuit design and greatly improves reliability.

As noted above, power amplifiers constructed in accordance with the teachings of the invention are compatible with a wide variety of load devices which need not be well behaved, particularly conventional loud speakers having a complex reactance which may be nonlinear and which have characteristics that change with frequency and are regenerative (i.e. supply power back to the amplifier circuit during various portions of the operating cycle).

Lastly, the usable frequency band of the amplifier is only limited by the maximum switching frequency of controllable switch 16 and may extend from zero to several thousand KHZ. Thus, the invention may be used as an audio power amplifier, a power amplifier for a servo control system, a cathode ray tube deflection amplifier, an electric motor drive amplifier, and in any other application requiring the delivery of high power to a utilization device in accordance with a control signal.

While the above provides a full and complete disclosure of the preferred embodiments of the invention, various modifications, alternate constructions and equivalents may be employed without departing from the true spirit and scope of the invention. Therefore, the above description and illustrations should not be construed as limiting the scope of the invention which is defined by the appended claims.

What is claimed is:

1. A high efficiency power conditioner for providing power amplification of relatively low power input signals, said power conditioner comprising:
   power input terminal means adapted to be coupled to an AC voltage source of electrical power;
   high power signal output terminal means adapted to be coupled to a utilization device;
   means coupled to said power input terminal means for converting AC voltages supplied thereto to first and second relatively high DC voltages of different levels, said converting means having first and second output terminals for said first and second relatively high DC voltages, respectively;
   controllable switch means having first and second power input terminals coupled respectively to said first and second output terminals of said converting means, an output terminal coupled to said high power signal output terminal means and a control input terminal, said switch means including means responsive to signals present on said control input terminal for alternately coupling said first and second DC voltages of different levels to said output terminal thereof; and
   signal processing means having a first input adapted to be coupled to a source of said relatively low power input control signals, a second input coupled to said high power signal output terminal as a feedback signal path, and an output terminal coupled to said control input terminal of said switch means, said signal processor including means for generating relatively low power control signals from said input control signals and a portion of those signals present on the feedback signal path for controlling the state of said switch means, said switch means alternately coupling said first and second DC voltages of different levels to said output terminal thereof in response to said relatively low power control signals from said signal processing means.

2. The combination of claim 1 wherein said converting means comprises a full wave bridge rectifier circuit.

3. The combination of claim 2 wherein said converting means further includes a low pass filter circuit coupled to the output of said full wave bridge rectifier circuit.

4. The combination of claim 1 further including a low pass filter circuit having input terminal means coupled to said output terminal of said controllable switch means and output terminal means coupled to said high power signal output terminal means of said power conditioner.

5. The combination of claim 1 wherein said converting means comprises a pair of rectifiers each having an output coupled to a different one of a pair of low pass filter circuits, each low pass filter circuit having an output terminal coupled to a different one of said first and second power input terminals of said switch means.

6. The combination of claim 1 wherein said controllable switch means comprises a pair of power switching transistors of opposite conductivity type intercoupled in a series collector configuration, each said transistor having an emitter coupled to a different one of said first and second power input terminals, the collector of each said transistor being coupled to said output terminal of said switch means; and control circuit means having a pair of output terminals each coupled to the base of a different one of said transistors for switching said pair of transistors to alternate states in accordance with the level of said low power control signals from said signal processor means.

7. The combination of claim 6 wherein said control circuit means includes priority means for preventing simultaneous switching of said transistors to the heavy conduction state.

8. The combination of claim 7 wherein said control circuit means includes first and second complementary circuits each having an input coupled to said control input terminal of said switch means and an output terminal coupled to the base of a different one of said transistors, and wherein said priority means includes means responsive to one of said pair of transistors being in the heavy conduction state for generating a priority signal for preventing the complementary circuit associated with the other one of said pair of transistors from switching the other transistor to the heavy conduction state.

9. The combination of claim 7 wherein said priority means includes delay means for providing a time delay between the switching of either one of said pair of transistors from the heavy conduction state to the off state and the switching of the remaining one of said pair of transistors from the off state to the heavy conduction state.

10. The combination of claim 6 wherein said controllable switch means further includes a pair of unidirectional conducting devices each coupled between the collector and the emitter of a different one of said pair of transistors for limiting the magnitude of the voltage therebetween to a predetermined value.

11. The combination of claim 1 wherein said signal processing means comprises a pulse frequency modulated circuit.

12. The combination of claim 1 wherein said signal processor means comprises a pulse width modulated circuit.

13. The combination of claim 1 wherein said signal processor means comprises a first means for generating a first reference signal from a comparison of said low power input control signals and said feedback signals, and second means coupled to the output of said first signal generating means for generating said low power control signals from a comparison of said first reference signal with a first reference potential.

14. The combination of claim 13 wherein said first reference signal generating means comprises a voltage dropping circuit having an input coupled to said second input of said signal processor means, and an output;
a summing network having first and second inputs coupled to said output of said voltage dropping circuit and said first input of said signal processor means, respectively, and an output; and
an operational amplifier having first and second input terminals coupled to said summing network and a second reference potential.

15. The combination of claim 13 wherein said low power control signal generating means comprises a comparator circuit having first and second input terminals couled to the output of said first signal generating means and said first reference potential, respectively.

16. The combination of claim 15 wherein said comparator circuit includes an operational amplifier having a pair of input terminals which comprise said first and second comparator circuit input terminals.

* * * * *

UNITED STATES PATENT AND TRADEMARK OFFICE
CERTIFICATE OF CORRECTION

PATENT NO. : 4,042,890
DATED : August 16, 1977
INVENTOR(S) : Joseph S. Eckerle

It is certified that error appears in the above—identified patent and that said Letters Patent is hereby corrected as shown below:

In column 6, line 9, change "(1/c)." to -- $(1/w_c)$. --.

In column 6, line 33, change "1./w)$_c$." to -- $(1/w_c)$. --.

Signed and Sealed this

Thirteenth Day of July 1982

[SEAL]

Attest:

Attesting Officer

GERALD J. MOSSINGHOFF
*Commissioner of Patents and Trademarks*

REEXAMINATION CERTIFICATE (772nd)
United States Patent [19]
Eckerle

[11] B1 4,042,890
[45] Certificate Issued Oct. 20, 1987

[54] HIGH EFFICIENCY ELECTRICAL POWER CONDITIONER

[76] Inventor: Joseph S. Eckerle, Star Rte. 2, La Honda, Calif. 94020

Reexamination Request:
No. 90/000,749, Mar. 28, 1985

Reexamination Certificate for:
Patent No.: 4,042,890
Issued: Aug. 16, 1977
Appl. No.: 686,332
Filed: May 14, 1976

Certificate of Correction issued Jul. 13, 1982.

[51] Int. Cl.$^4$ .................. H03F 3/38; H03F 21/00
[52] U.S. Cl. .................. 330/207 A; 330/10; 330/251; 330/297
[58] Field of Search ............ 330/10, 207 A, 251, 330/297

[56] References Cited

U.S. PATENT DOCUMENTS

| | | | |
|---|---|---|---|
| 3,182,268 | 5/1965 | Burwen | 330/10 |
| 3,294,981 | 12/1966 | Bose | 307/290 X |
| 3,495,181 | 2/1970 | Reiffin | 330/297 X |
| 3,636,380 | 1/1972 | Anderson | 330/251 X |
| 3,818,366 | 6/1974 | Arimura et al. | 330/207 P |
| 3,854,100 | 12/1974 | Pouzadoux | 330/207 A |
| 4,041,411 | 8/1977 | Sturgeon | 330/207 A |

OTHER PUBLICATIONS

Jay, Frank *IEEE Standard Dictionary of Electrical and Electronics Terms*, The Institute of Electrical and Electronics Engineers, Inc., ANSI/IEEE Std 100-1984, Third Edition, p. 147.
Turner, Rufus P., *The Illustrated Dictionary of Electronics*, Tab Books, Feb. 1980, pp. 140–141.
Parker, Sybil P., *Encyclopedia of Electronics and Computers*, McGraw-Hill Book Company, 1984, p. 25.
Freyling, N., "High Performance All Solid-State Servo Amplifier," Motorola Application Note AN-225, Jan. 1966, included in *Sourcebook of Electronic Circuits*, edited by J. Markus, McGraw-Hill, 1968, p. 655.
Schematic drawing 103805B, "Power Amplifier," Xynetics, Inc., Canoga Park, California, Operating Manual, Electroglas Model 1034X Prober, Nov. 11, 1973, p. 39.
National Semiconductor Application Note, AN-1, "A Versatile Monolithic Voltage Regulator," Nov., 1967.
Electro-craft Corporation, *DC Motors Speed Controls Servo Systems*, Oct. 1973, pp. 3-20 through 3-25.
Bose, A. G., "A Two-State Modulation System," WESCON Technical Papers, vol. 7, Part 6, No. 7.1, 1963.
Terman, *Electronic and Radio Engineering*, McGraw-Hill, 1955, pp. 707–721, 725–727.
The Radio Amateurs' Handbook, Forty-Ninth edition, 1972, pp. 65–67.

*Primary Examiner*—James B. Mullins

[57] ABSTRACT

An A.C. powered amplifier for converting low power information input signals to corresponding signals of a substantially increased power level without requiring a power transformer. A signal processor having a low power information signal input and a feedback signal input controls the state of a controllable switch. The switch power input is coupled to a source of relatively high A.C. voltage via a rectifier circuit and a first low pass filter circuit, and the switch output is coupled to the amplifier output terminal via a second low pass filter circuit. A feedback path is provided from either the switch output or the amplifier output terminal to the feedback signal input of the signal processor. The signal processor may comprise a pulse width, or pulse frequency modulation circuit.

The amplifier provides high efficiency, low power loss, and has a band width limited only by the maximum switching frequency of the controllable switch.

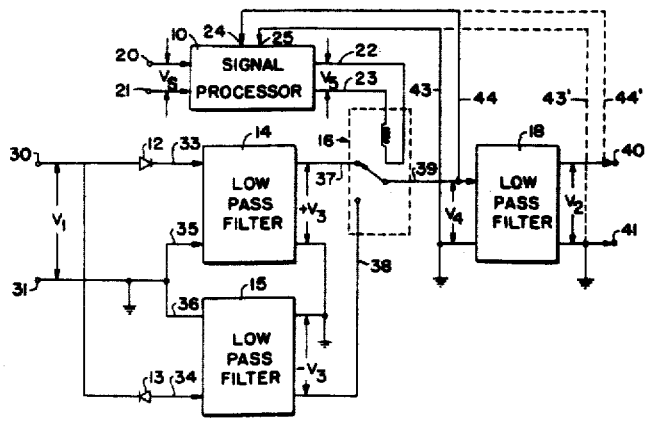

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 1, lines 53–61:

The invention comprises a *Class D* power amplifier circuit which requires no power transformer operating at the A.C. mains frequency and no output transformer, which operates in a switching mode to provide high efficiency and inherent stability, which is compatible with a wide variety of loads, and which possesses an extremely wide band width limited at the upper end only by the maximum possible switching frequency of one of the sub-units of the invention.

Column 6, lines 50–68:

FIG. 5 shows the preferred embodiment of controllable switch 16. As shown in this FIG., controllable switch 16 includes a pair of power transistors 100, 101 of opposite conductivity type intercoupled in a common collector configuration. The emitter of transistor 100 is coupled to high positive reference D.C. voltage [$-V_3$] $+V_3$, while the emitter of transistor 101 is coupled to high negative reference D.C. voltage $-V_3$. The output signal is taken from the junction of the collectors of transistors 100, 101. Diodes 103, 104 limit the voltage on output terminal 39 to [$-V_3$] $+V_3$ or $-V_3$ and are deemed necessary due to the inductance 57 present in low pass filter 18 to which terminal 39 is coupled.

The remaining circuit elements control the switching of transistors 100, 101 so that [$-V_3$] $+V_3$ is coupled to terminal 39 when transistor 100 is conducting and transistor 101 is switched off, and so that $-V_3$ is coupled to terminal 39 when transistor 101 is switched on and transistor 100 is switched off.

Column 8, lines 63–68:

FIGS. 10 and 11 illustrate an alternate embodiment of signal processor 10 which provides pulse frequency modulation and which shares in common with the embodiment of FIGS. 8 and 9 elements 61–64, 150 and 160[, the]. *The* embodiment of FIGS. 10 and 11 includes an offset voltage source 200 comprising operational amplifier 201

AS A RESULT OF REEXAMINATION, IT HAS BEEN DETERMINED THAT:

Claims 1–16 are cancelled.

* * * * *

REEXAMINATION CERTIFICATE (1346th)
United States Patent [19]
Eckerle

[11] B1 4,042,890
[45] Certificate Issued * Sep. 4, 1990

[54] HIGH EFFICIENCY ELECTRICAL POWER CONDITIONER

[76] Inventor: Joseph S. Eckerle, Star Route 2, La Honda, Calif. 94020

Reexamination Request:
No. 90/000,749, Mar. 28, 1985

Reexamination Certificate for:
Patent No.: 4,042,890
Issued: Aug. 16, 1977
Appl. No.: 686,332
Filed: May 14, 1976

[ * ] Notice: The portion of the term of this patent subsequent to Mar. 16, 1994 has been disclaimed.

Certificate of Correction issued Jul. 13, 1982.

[51] Int. Cl.$^5$ .................................. H03F 21/00
[52] U.S. Cl. ............................ 330/207 A; 330/10; 330/51; 330/251
[58] Field of Search .............. 330/10, 207 A, 251, 330/297

[56] References Cited

U.S. PATENT DOCUMENTS

| | | | |
|---|---|---|---|
| 3,182,268 | 5/1965 | Burwen | 330/10 |
| 3,294,981 | 12/1966 | Bose | 307/290 X |
| 3,495,181 | 2/1970 | Reiffin | 330/297 X |
| 3,636,380 | 1/1972 | Anderson | 330/251 X |
| 3,818,366 | 6/1974 | Arimura et al. | 330/207 P |
| 3,854,100 | 12/1974 | Pouzadoux | 330/207 A |
| 4,041,411 | 8/1977 | Sturgeon | 330/207 A |

OTHER PUBLICATIONS

Jay, Frank, *IEEE Standard Dictionary of Electrical and Electronics Terms*, The Institute of Electrical and Electronics Engineers, Inc., ANSI/IEEE Std 100-1984, Third Edition, p. 147.
Turner, Rufus P., *The Illustrated Dictionary of Electronics*, Tab Books, Feb. 1980, pp. 140-141.
Parker, Sybil P., *Encyclopedia of Electronics and Computers*, McGraw-Hill Book Company, 1984, p. 25.
Freyling, N., "High Performance All Solid-State Servo Amplifier," Motorola Application Note AN-225, Jan. 1966, included in *Sourcebook of Electronic Circuits*, edited by J. Markus, McGraw-Hill, 1968, p. 655.
Schematic Drawing 103805B, "Power Amplifier," Xynetics, Inc., Canoga Park, Calif., Operating Manual, Electroglas Model 1034X Prober, Nov. 11, 1973, p. 39.
Terman, Frederick E., *Electronics and Radio Engineering*, McGraw-Hill, 1955, pp. 707-711.
National Semiconductor Application Note, AN-1, "A Versatile, Monolithic Voltage Regulator," Nov., 1967.
Electro-Craft Corporation, *DC Motors Speed Controls Servo Systems*, Oct., 1973, pp. 3-20 through 3-25.
Bose, A. G., "A Two-State Modulation System," Wescon Technical Papers, vol. 7, Part 6, No. 7.1, 1963.
Erman, Electronic and Radio Engineering, McGraw-Hill, 1955, pp. 712-721, 725-727.
The Radio Amateur's Handbook, Forty-Ninth Edition, 1972, pp. 65-67.

*Primary Examiner*—James B. Mullins

[57] ABSTRACT

An A.C. powered amplifier for converting low power information input signals to corresponding signals of a substantially increased power level without requiring a power transformer. A signal processor having a low power information signal input and a feedback signal input controls the state of a controllable switch. The switch power input is coupled to a source of relatively high A.C. voltage via a rectifier circuit and a first low pass filter circuit, and the switch output is coupled to the amplifier output terminal via a second low pass filter circuit. A feedback path is provided from either the switch output or the amplifier output terminal to the feedback signal input of the signal processor. The signal processor may comprise a pluse width, or pulse frequency modulation circuit.

The amplifier provides high efficiency, low power loss, and has a band width limited only by the maximum switching frequency of the controllable switch.

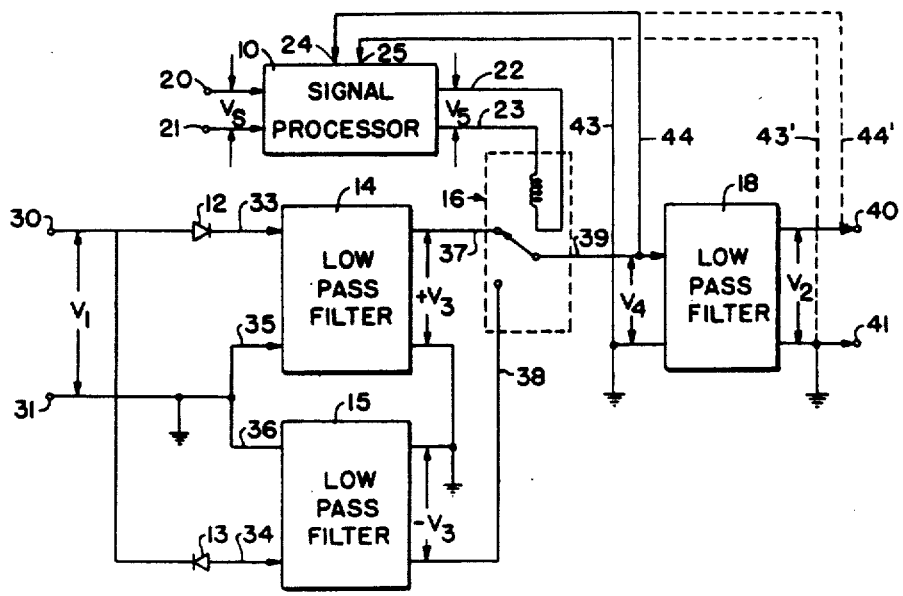

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-16 are cancelled.

* * * * *